US008431925B2

(12) United States Patent
Li et al.

(10) Patent No.: US 8,431,925 B2
(45) Date of Patent: Apr. 30, 2013

(54) ORGANIC ELECTRONIC DEVICES, COMPOSITIONS, AND METHODS

(75) Inventors: Sergey B. Li, Glenshaw, PA (US); Shawn P. Williams, Pittsburgh, PA (US); Brian E. Woodworth, Pittsburgh, PA (US); Pierre Marc Allemand, San Jose, CA (US); Rimple Bhatia, Los Altos, CA (US); Hash Pakbaz, Bloomingdale, IL (US)

(73) Assignees: Plextronics, Inc., Pittsburgh, PA (US); Cambrios Technologies Corp., Sunnyvale, CA (US)

( * ) Notice: Subject to any disclaimer, the term of this patent is extended or adjusted under 35 U.S.C. 154(b) by 13 days.

(21) Appl. No.: 12/890,493

(22) Filed: Sep. 24, 2010

(65) Prior Publication Data

US 2011/0095275 A1    Apr. 28, 2011

Related U.S. Application Data

(60) Provisional application No. 61/246,913, filed on Sep. 29, 2009.

(51) Int. Cl.
*H01L 51/50* (2006.01)
(52) U.S. Cl.
USPC 257/40; 257/103; 257/E51.029; 257/E33.001
(58) Field of Classification Search .................. 257/40, 257/79, 103, E51.028, E51.029, E51.03, 257/E33.001; 977/762, 932
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 4,737,557 A | 4/1988 | Sato et al. | |
| 4,909,959 A | 3/1990 | Lemaire et al. | |
| 5,247,190 A | 9/1993 | Friend et al. | |
| 5,401,827 A | 3/1995 | Holmes et al. | |
| 5,454,880 A | 10/1995 | Sariciftci et al. | |
| 6,166,172 A | 12/2000 | McCullough et al. | |
| 6,602,974 B1 | 8/2003 | McCullough et al. | |
| 6,812,399 B2 | 11/2004 | Shaheen et al. | |
| 6,933,436 B2 | 8/2005 | Shaheen et al. | |
| 6,936,761 B2* | 8/2005 | Pichler | 136/256 |
| 7,569,159 B2 | 8/2009 | Hammond et al. | |
| 7,790,979 B2 | 9/2010 | Williams et al. | |
| 2004/0206942 A1* | 10/2004 | Hsu | 252/500 |
| 2004/0254297 A1* | 12/2004 | Hsu et al. | 525/54.2 |
| 2005/0222333 A1* | 10/2005 | Hsu | 525/178 |
| 2006/0062983 A1* | 3/2006 | Irvin et al. | 428/220 |
| 2006/0076050 A1* | 4/2006 | Williams et al. | 136/263 |
| 2006/0078761 A1 | 4/2006 | Williams et al. | |
| 2006/0175582 A1* | 8/2006 | Hammond et al. | 252/500 |
| 2006/0237695 A1 | 10/2006 | Williams et al. | |
| 2006/0292362 A1 | 12/2006 | Hsu et al. | |
| 2007/0004899 A1* | 1/2007 | Hsu et al. | 528/377 |
| 2007/0074316 A1* | 3/2007 | Alden et al. | 977/762 |
| 2007/0246689 A1* | 10/2007 | Ge et al. | 252/500 |
| 2008/0023066 A1* | 1/2008 | Hecht et al. | 136/256 |
| 2008/0023067 A1* | 1/2008 | Hu et al. | 136/256 |
| 2008/0224128 A1 | 9/2008 | Kim et al. | |
| 2008/0248313 A1 | 10/2008 | Seshadri et al. | |
| 2008/0248314 A1* | 10/2008 | Hsu et al. | 428/419 |
| 2008/0319207 A1 | 12/2008 | Laird et al. | |
| 2009/0117327 A1* | 5/2009 | Takada | 428/141 |
| 2009/0230361 A1 | 9/2009 | Seshadri et al. | |
| 2009/0235988 A1* | 9/2009 | Jenekhe et al. | 136/263 |
| 2009/0256117 A1 | 10/2009 | Seshadri et al. | |
| 2010/0072462 A1 | 3/2010 | Brown et al. | |
| 2010/0096004 A1* | 4/2010 | Hu et al. | 136/256 |
| 2010/0102309 A1* | 4/2010 | Nakahara et al. | 257/43 |
| 2010/0108954 A1 | 5/2010 | Benson-Smith et al. | |
| 2010/0132782 A1 | 6/2010 | Laird et al. | |
| 2010/0243295 A1 | 9/2010 | Allemand et al. | |

FOREIGN PATENT DOCUMENTS

WO  WO 2008/046058 A2  4/2008
WO  WO 2008/073149 A2  6/2008

OTHER PUBLICATIONS

SolarTown Learning, "Solar Panel Efficiency: Have you check your eta lately?" (2010). (http://www.solartown.com/learning/solar-panels/solar-panel-efficiency-have-you-checked-your-eta-lately).*
International Search Report in related PCT application PCT/US2010/050250, date (2010).
Written Opinion in related PCT application PCT/US2010/050250, date (2010).
Rowell, M. et al., "Organic solar cells with carbon nanotube network electrodes," 88 App. Phys. Lett. 233506 (2006).
U.S. Appl. No. 60/612,640, filed Sep. 24, 2004, Williams et al.
U.S. Appl. No. 60/612,641, filed Sep. 24, 2004, Williams et al.
U.S. Appl. No. 60/812,961, filed Jun. 13, 2006, Laird et al.
U.S. Appl. No. 60/832,095, filed Jul. 21, 2006, Seshadri et al.
U.S. Appl. No. 60/845,172, filed Sep. 18, 2006, Seshadri et al.
U.S. Appl. No. 60/851,652, filed Oct. 12, 2006, Alden et al.
U.S. Appl. No. 60/913,231, filed Apr. 20, 2006, Allemand et al.
U.S. Appl. No. 60/911,058, filed Apr. 10, 2007, Alden et al.
U.S. Appl. No. 61/032,905, filed Feb. 29, 2008, Seshandri et al.
U.S. Appl. No. 60/034,476, filed Mar. 6, 2008, Seshadri et al.
U.S. Appl. No. 60/108,844, filed Oct. 27, 2008, Mathai et al.
U.S. Appl. No. 60/108,851, filed Oct. 27, 2008, Seshadri et al.
U.S. Appl. No. 61/115,877, filed Nov. 18, 2008, Seshadri et al.
U.S. Appl. No. 12/620,514, filed Nov. 17, 2009, Brown et al.

(Continued)

*Primary Examiner* — Jarrett Stark
*Assistant Examiner* — Michele Fan
(74) *Attorney, Agent, or Firm* — Foley & Lardner LLP

(57) ABSTRACT

Organic electronic devices, compositions, and methods are disclosed that employ electrically conductive nanowires and conducting materials such as conjugated polymers such as sulfonated regioregular polythiophenes which provide high device performance such as good solar cell efficiency. Devices requiring transparent conductors that are resilient to physical stresses can be fabricated, with reduced corrosion problems.

19 Claims, No Drawings

OTHER PUBLICATIONS

Francois, B. et al., "Block-copolymers with conjugated segments: Synthesis and structural characterization," 69 *Synth. Met.* 463 (1995).

Fukase, A. et al., "High-efficiency organic electroluminescent devices using iridium complex emitter and arylamine-containing polymer buffer layer," 13 *Polymers for Advanced Technologies*, 601 (2002).

Hempenius, M. et al., "A Polystyrene-Oligothiophene-Polystyrene Triblock Copolymer," 120 *J. Am. Chem. Soc.* 2798 (1998).

Jenekhe, S. et al., "Self-Assembled Aggregates of Rod-Coil Block Copolymers and Their Solubilization and Encapsulation of Fullerenes," 279 *Science* 1903 (1998).

Katz et al., "Synthetic Chemistry for Ultrapure, Processable, and High-Mobility Organic Transistor Semiconductors," 34 *Accounts of Chemical Research* 359 (2001).

Kraft, A. et al., "Electroluminescent Conjugated Polymers—Seeing Polymers in a New Light," 37 *Angew. Chem. Int. Ed.* 402 (1998).

Kroschwitz, J. ed. et al., *Concise Encyclopedia of Polymer Science and Engineering*, 298-300, Wiley (1990).

Li, W. et al., "Syntheses of Oligophenylenevinylenes-Polyisoprene Diblock Copolymers and Their Microphage Separation," 32 *Macromolecules* 3034 (1999).

Li, Z., ed. et al., *Organic Light-Emitting Materials and Devices*, CRC Press, Taylor an Francis Group, LLC, Boca Raton (2007).

Lim, B. et al., "Synthesis of a New Cross-Linkable Perfluorocyclobutane-Based Hole-Transport Material," 8 *Organic Letter* 4703 (2006).

McCullough, R., "The Chemistry of Conducting Polythiophenes," 10 *Adv. Mater.* 93 (1998).

McCullough, R., "Electroluminescence in Conjugated Polymers," *Handbook of Conducting Polymers*, $2^{nd}$ *Ed.* 823-846 (1998).

McCullough, R., "Regioregular, Head-to-Tail Coupled Poly(3-alkylthiophene) and its Derivatives," *Handbook of Conducting Polymers*, $2^{nd}$ *Ed.* 225-258 (1998).

Noshay, A. et al., *Block Copolymers, Overview and Critical Survey*, Academic Press (1977).

Roncali, J., "Conjugated poly(thiophenes): synthesis, functionalization, and applications," 92 *Chem. Rev.* 711 (1992).

Schopf, G. et al., *Polythiophenes: Electrically Conductive Polymers*, Springer, Berlin, 1997.

Shirota, Y. et al., "Charge Carrier Transporting Molecular Materials and Their Applications in Devices," 107 *Chem. Rev.* 953 (2007).

Sun, S. ed. et al., *Organic Photovoltaics*, Taylor and Francis, Boca Raton (2005).

Sun, Y. et al., "Polyol Synthesis of Uniform Silver Nanowires: A Plausible Growth Mechanism and the Supporting Evidence," 3 *Nanoletters*, 955 (2003).

Sun, Y. et al., "Uniform Silver Nanowires Synthesis by Reducing AgNO3 with Ethylene Glycol in the Presence of Seeds and Poly(Vinyl Pyrrolidone)," 14 *Chem. Mater.* 4736 (2002).

Wang, H. et al., "Syntheses of Amphiphilic Diblock Copolymers Containing a Conjugated Block and Their Self-Assembling Properties," 122 *J. Am. Chem. Soc.* 6855 (2000).

Widawski, G. et al., "Self-organized honeycomb morphology of star-polymer polystyrene films," 369 *Nature* 387 (1994).

Yang, Z. et al., "A soluble blue-light-emitting polymer," 26 *Macromolecules* 1188 (1993).

\* cited by examiner

ORGANIC ELECTRONIC DEVICES, COMPOSITIONS, AND METHODS

RELATED APPLICATIONS

This application claims priority to U.S. provisional application Ser. No. 61/246,913 filed Sep. 29, 2009 and incorporated herein by reference in its entirety.

BACKGROUND

Improved materials and combinations of materials are needed for organic electronic devices which employ transparent conductors, such as organic light emitting diodes (OLEDs), polymer light emitting diodes (PLEDs), organic photovoltaic devices (OPVs), flat liquid crystal displays, touch panels, and the like. Transparent conductors based on conductive nanowires have been proposed to address shortcomings of traditional metal oxide materials, such as indium tin oxide (ITO). However, transparent conductors, including those based on nanowires, may not function well with other materials.

SUMMARY

Embodiments described herein include, for example, compositions, both liquid and solid, devices, articles, methods of making, and methods of using compositions, article, and devices.

One embodiment provides a device comprising: a first layer comprising a plurality of electrically conductive nanowires on a substrate; and a second layer disposed on the nanowires comprising one or more polymers or copolymers, said one or more polymers or copolymers comprising (i) at least one conjugated repeat group, or (ii) at least one heteroaryl group, optionally linked through a keto group or a fluorinated alkylene oxide group. An example of a heteroaryl group is arylamine which can be part of a polyarylamine.

Another embodiment provides a device comprising: a plurality of electrically conductive nanowires on a substrate, and a composition disposed on the nanowires comprising one or more conjugated polymers or copolymers, wherein said device comprises an OPV with η greater than about 2%.

Another embodiment provides a device comprising: a plurality of electrically conductive nanowires on a substrate, and at least one composition disposed on the nanowires comprising a water soluble or water dispersible polythiophene comprising (i) at least one organic substituent, and (ii) at least one sulfonate substituent comprising sulfonate sulfur bonding directly to the polythiophene backbone.

Another embodiment provides a device comprising: a conductive layer comprising a plurality of conductive nanowires and a non-conductive matrix, and an HTL layer disposed on said conductive layer, said HTL layer comprising one or more polythiophene polymers or copolymers.

Another embodiment provides a device comprising at least one conductive layer, said at least one conductive layer comprising: a plurality of electrically conductive nanowires, and at least one composition comprising a water soluble or water dispersible regioregular polythiophene comprising (i) at least one organic substituent, and (ii) at least one sulfonate substituent comprising sulfonate sulfur bonding directly to the polythiophene backbone.

Another embodiment provides a device comprising at least one conductive layer and at least one other layer disposed on the conductive layer, said at least one conductive layer comprising a plurality of electrically conductive nanowires, and said at least one other layer selected from the group: hole injection layer, hole transport layer, overcoat layer, or hole collection layer, wherein said at least one other layer comprises at least one composition comprising a water soluble or water dispersible regioregular polythiophene comprising (i) at least one organic substituent, and (ii) at least one sulfonate substituent comprising sulfonate sulfur bonding directly to the polythiophene backbone.

Another embodiment provides a device comprising: a first layer comprising a plurality of electrically conductive nanowires on a substrate; and a second layer disposed on the nanowires comprising one or more polymers or copolymers, said one or more polymers or copolymers comprising at least one heteroaryl group or at least one polyarylamine, wherein said heteroaryl group or polyarylamine are optionally linked through a keto group or a fluorinated alkyleneoxy group.

At least one advantage of at least one embodiment includes solution processing of electrodes. Use of vacuum can be avoided. Use of traditional ITO can be avoided. At least one additional advantage of at least one embodiment includes high conductivity electrodes. At least one advantage of at least one embodiment includes efficient charge collection and/or injection. At least one advantage of at least on embodiment includes high electrode conductivity combined with efficient charge collection and/or injection. At least one advantage of at least one embodiment includes flexibility in the substrate and the electrode, avoiding relatively brittle materials. At least one advantage of at least one embodiment includes good performance of nanowire based electrodes in organic electronic devices including relatively high efficiency, particularly for organic photovoltaic cells with high power conversion efficiency.

DETAILED DESCRIPTION

Introduction

Priority U.S. provisional application Ser. No. 61/246,913 filed Sep. 29, 2009 is incorporated herein by reference in its entirety, including working examples, claims, summary, detailed description, and all other embodiments.

All references described herein are hereby incorporated by reference in their entirety.

Transparent conductors can refer to thin conductive films coated on high-transmittance surfaces or substrates. Transparent conductors can be manufactured to have surface conductivity while maintaining reasonable optical transparency. Such surface conducting transparent conductors can be used as transparent electrodes in, for example, flat liquid crystal displays, touch panels, electroluminescent devices, thin film photovoltaic cells, anti-static layers, and as electromagnetic wave shielding layers.

Currently, vacuum deposited metal oxides, such as indium tin oxide (ITO), are the industry standard materials to provide optical transparency and electrical conductivity to dielectric surfaces such as glass and polymeric films. However, metal oxide films can be fragile and prone to damage during bending or other physical stresses. They can also require elevated deposition temperatures and/or high annealing temperatures to achieve high conductivity levels. They may also have difficulties adhering to some plastic or organic substrates.

Described herein are embodiments which use conductive nanowires in transparent conductors which can be used in combination with an overcoat material. Overcoat materials used with conductive nanowires can suffer from inefficient charge collection and injection, leading to low device efficiencies. Other overcoat materials intended to improve device efficiencies can be injurious to the nanowire network.

Accordingly, described herein are superior overcoat materials that can provide efficient charge collection and/or injection, without sacrificing the high conductivity provided by the nanowire network.

Conductive Nanowires

U.S. provisional patent application Ser. No. 60/851,652 "Nanowires-Based Transparent Conductors" filed Oct. 12, 2006 to Alden, et al.; U.S. provisional application Ser. No. 60/911,058 "Nanowires-Based Transparent Conductors and Applications Thereof" filed Apr. 10, 2007 to Alden et al.; U.S. provisional patent application Ser. No. 60/913,231 "Applications and Methods for Conductive Films" filed Apr. 20, 2006 to Allemand et al.; and U.S. patent application Ser. No. 11/871,761 "Nanowire-Based Transparent Conductors and Applications Thereof" filed Oct. 12, 2007 to Allemand et al. are hereby incorporated by reference in their entirety including figures, working examples, and claims.

Certain embodiments described herein are directed to a transparent conductor based on a conductive layer of nanowires. In particular, the conductive layer can comprise a sparse network of metal nanowires. In addition, the conductive layer can be transparent, flexible and can include at least one surface that is conductive. It can be coated or laminated on a variety of substrates, including flexible and rigid substrates. The conductive layer can also form part of a composite structure comprising a matrix material and the nanowires. The matrix material can typically impart certain chemical, mechanical and optical properties to the composite structure.

Suitable nanowires typically can have aspect ratios in the range of, for example, about 10 to about 100,000. The term "aspect ratio" can mean the ratio of a nanowire's length to its diameter, or to a cross-sectional perimeter length for non-spherical structures. Larger aspect ratios can be favored for obtaining a transparent conductor layer since they may enable more efficient conductive networks to be formed while permitting lower overall density of wires for a high transparency. When conductive nanowires with high aspect ratios are used, the density of the nanowires that achieves a conductive network can be low enough that the conductive network is substantially transparent.

One method to define the transparency of a layer to light is by its absorption coefficient. The illumination of light passing through a layer can be defined as:

$$I=I_o\exp(-ax)$$

in which $I_o$ is the illumination level of the incoming light on a first side of the layer, I is the illumination level that is present on a second side of the layer, and $\exp(-ax)$ is the transparency factor. In the transparency factor, a is the absorption coefficient and x is the thickness of the layer. A layer having a transparency factor near 1, but less than 1 can be considered to be substantially transparent.

The aspect ratio, size, shape and the distribution of the physical parameters of the nanowires can be selected to provide the desired optical and electrical properties. The number of such wires that will provide a given density of nanowires can be selected to provide acceptable electrical conduction properties. For example, a plurality of nanowires can extend between terminals to provide a low resistance electrical conduction path, and the concentration, aspect ratio, size and shape can be selected to provide a substantially transparent conductor.

The term "terminal" can includes contact pads, conduction nodes and any other starting and ending points that may be electrically connected. The distance between terminals may be such that the desired optical properties are not obtained with a single nanowire. A plurality of many nanowires may need to be linked to each other at various points to provide a conductive path between terminals. The nanowires can be selected based on the desired optical properties. Then, the number of nanowires that provides the desired conduction path and overall resistance on that path can be selected to achieve acceptable electrical properties for an electrical conduction between terminals.

The electrical conductivity of the transparent layer can be controlled by factors such as a) the conductivity of a single nanowire, b) the number of nanowires between terminals, and c) the connectivity between the nanowires. Below a certain nanowire concentration (also can be referred to as the percolation threshold, or electrical percolation level), the conductivity between the terminals can be zero or close to zero, i.e. there is no or substantially no continuous current path provided because the nanowires are spaced too far apart. Above this concentration, there is at least one current path available. As more current paths are provided, the overall resistance of the layer will decrease.

Conductive nanowires include metal nanowires and other conductive particles having high aspect ratios (e.g., higher than 10). Examples of non-metallic nanowires include, but are not limited to, carbon nanotubes (CNTs), metal oxide nanowires, conductive polymer fibers and the like.

As used herein, "metal nanowire" can refer to a metallic wire comprising element metal, metal alloys or metal compounds (including metal oxides). At least one cross-sectional dimension of the metal nanowire can be less than about 500 nm, or less than about 200 nm, or less than about 100 nm. As noted above, the metal nanowire can have an aspect ratio (length:diameter) of greater than 10, preferably greater than 50, and more preferably greater than 100. Suitable metal nanowires can be based on a variety of metals, including without limitation, silver, gold, copper, nickel, and gold-plated silver.

The metal nanowires can be prepared by known methods in the art. In particular, for example, silver nanowires can be synthesized through solution-phase reduction of a silver salt (e.g., silver nitrate) in the presence of a polyol (e.g., ethylene glycol) and poly(vinyl pyrrolidone). Large-scale production of silver nanowires of uniform size can be prepared according to the methods described in, e.g., Xia, Y. et al., *Chem. Mater.*, 2002, 14, 4736-4745, and Xia, Y. et al., *Nanoletters*, 2003, 3(7), 955-960.

Conductive Layer and Substrate

In certain embodiments, a transparent conductor comprises a conductive layer coated on or otherwise disposed on a substrate. The conductive layer can comprise a plurality of metal nanowires. The metal nanowires can form a conductive network.

In some embodiments, a conductive layer comprises a plurality of metal nanowires embedded in or otherwise mixed with a matrix.

"Substrate", or "substrate of choice", can refer to a material onto which the conductive layer is coated or laminated or otherwise disposed on. The substrate can be rigid or flexible. The substrate can be clear or opaque. The term "substrate of choice" can be used in connection with a lamination process. Suitable rigid substrates include, for example, glass, polycarbonates, acrylics, and the like. Suitable flexible substrates include, but are not limited to: polyesters (e.g., polyethylene terephthalate (PET) and polyethylene naphthalate), polycarbonates, polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric or plastic films. Additional examples of suitable substrates can be found in, for example, U.S. Pat. No. 6,975,067, which is hereby incorporated by reference in its entirety.

"Conductive layer", or "conductive film", can refer to a network layer of metal nanowires that provide the conductive media of the transparent conductor. When a matrix is present, the combination of the network layer of metal nanowires and the matrix can also be referred to as a "conductive layer". Since conductivity is achieved by electrical charge percolating from one metal nanowire to another, sufficient metal nanowires can be present in the conductive layer to reach an electrical percolation threshold and become conductive. The surface conductivity of the conductive layer can be inversely proportional to its surface resistivity, sometimes referred to as sheet resistance, which can be measured by known methods in the art.

Likewise, when a matrix is present, the matrix can be filled with sufficient metal nanowires to become conductive. As used herein, "threshold loading level" refers to a percentage of the metal nanowires by weight after loading of the conductive layer at which the conductive layer has a surface resistivity of no more than about $10^6$ ohm/square ($\Omega$/sq). More typically, the surface resistivity is no more than $10^5$ $\Omega$/sq, no more than $10^4$ $\Omega$/sq, no more than 1,000 $\Omega$/sq, no more than 500 $\Omega$/sq, or no more than 100 $\Omega$/sq. The threshold loading level depends on factors such as the aspect ratio, the degree of alignment, degree of agglomeration and the resistivity of the metal nanowires.

As is understood by one skilled in the art, the mechanical and optical properties of the matrix can be altered or compromised by a high loading of any particles therein. Advantageously, the high aspect ratios of the metal nanowires can allow for the formation of a conductive network through the matrix at a threshold surface loading level preferably of about 0.05 $\mu$g/cm$^2$ to about 10 $\mu$g/cm$^2$, more preferably from about 0.1 $\mu$g/cm$^2$ to about 5 $\mu$g/cm$^2$ and more preferably from about 0.8. $\mu$g/cm$^2$ to about 3 $\mu$g/cm$^2$ for nanowires including silver nanowires. These surface loading levels do not affect the mechanical or optical properties of the matrix. These values can depend on the dimensions and spatial dispersion of the nanowires. Advantageously, transparent conductors of tunable electrical conductivity (or surface resistivity) and optical transparency can be provided by adjusting the loading levels of the metal nanowires.

"Matrix" can refer to a solid-state material into which the metal nanowires are dispersed or embedded. Portions of the nanowires may protrude from the matrix material to enable access to the conductive network. The matrix can be a host for the metal nanowires and provides a physical form of the conductive layer. The matrix can protect the metal nanowires from adverse environmental factors, such as, for example, corrosion and abrasion. In particular, the matrix can significantly lower the permeability of corrosive elements in the environment, such as moisture, trace amount of acids, oxygen, sulfur and the like.

In addition, the matrix can offer favorable physical and mechanical properties to the conductive layer. For example, it can provide adhesion to the substrate. Furthermore, unlike metal oxide films, polymeric or organic matrices embedded with metal nanowires can be robust and flexible. Flexible matrices can make it possible to fabricate transparent conductors in a low-cost and high throughput process.

Moreover, the optical properties of the conductive layer can be tailored by selecting an appropriate matrix material. For example, reflection loss and unwanted glare can be effectively reduced by using a matrix of a desirable refractive index, composition and thickness.

Typically, the matrix is an optically clear material. A material can be considered "optically clear" or "optically transparent", if the light transmission of the material is at least 80% in the visible region (400 nm-700 nm). In some embodiments, all the layers (including the substrate and the nanowire network layer) in a transparent conductor described herein are optically clear. The optical clarity of the matrix can be determined by a multitude of factors, including without limitation: the refractive index (RI), thickness, consistency of RI throughout the thickness, surface (including interface) reflection, and haze (a scattering loss caused by surface roughness and/or embedded particles).

In certain embodiments, the matrix can be a polymer, which is also referred to as a polymeric matrix. Optically clear polymers are known in the art. Examples of suitable polymeric matrices include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET) and polyethylene naphthalate), polycarbonates, polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g., EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon AF® by Du Pont).

In other embodiments, the polymeric matrix described herein can comprise partially polymerized or partially cured polymer. Compared to a fully polymerized or fully cured matrix, a partially cured matrix can have lesser degree of cross-linking and/or polymerization and lower molecular weight. Thus, the partially polymerized matrix can be etched under certain conditions and patterning is possible using conventional photolithography. Under a proper polymerization condition, the partially cured matrix may be further cured whereby further cross-linking and polymerization are carried out to provide a matrix of higher molecular weight than that of a partially cured matrix. The partially cured matrix can be etched, followed by a further curing step, to provide a patterned and fully-cured transparent conductor film. Examples of suitable partially cured polymers include, but are not limited to partially cured acrylate, silicone-epoxy, siloxane, novolac, epoxy, urethane, silsesquioxane or polyimide.

One skilled in the art would recognize that the degree of polymerization may impact the etching condition (solution) under which the partially polymerized matrix and/or nanowires can dissolve. Typically, the higher the degree of polymerization, the more difficult it is to etch the matrix.

Preferably, the partially cured matrix has an acceptable degree of physical integrity to protect the nanowires within. This is desirable because an end-user may carry out her own patterning and the subsequent curing to obtain a final transparent conductor film.

In certain embodiments, the matrix itself can be conductive. For example, the matrix can be a conductive polymer.

Conductive polymers are well known in the art, including without limitation: poly(3,4-ethylenedioxythiophene) (PEDOT), polyanilines, polythiophenes, and polydiacetylenes. Doped materials can be used if needed.

In certain embodiments, conductive polymers comprising regioregular polythiophene or sulfonated polythiophene, or sulfonated regioregular polythiophenes can be used to decrease the corrosion that may occur when using such polymers as PEDOT. In addition to corrosion issues, PEDOT may not allow sufficient charge transfer to occur when it is used in an organic electronic device, including, for example, in an OLED or and OPV. For example, in some embodiments, one may make an organic electronic device with PEDOT, one may try to use it, and the device may not work or may not work well.

Nanowire Deposition and Transparent Conductor Fabrication

In certain embodiments, it is thus described herein a method of fabricating a transparent conductor comprising: depositing a plurality of metal nanowires on a substrate, the metal nanowires being dispersed in a fluid; and forming a metal nanowire network layer on the substrate by allowing the fluid to dry.

The metal nanowires can be prepared as described above. The metal nanowires are typically dispersed in a liquid to facilitate the deposition. It is understood that, as used herein, "deposition" and "coating" are used interchangeably. Any non-corrosive liquid in which the metal nanowires can form a stable dispersion (also called "metal nanowires dispersion") can be used. Preferably, the metal nanowires are dispersed in water, an alcohol, a ketone, ethers, hydrocarbons or an aromatic solvent (benzene, toluene, xylene, etc.). More preferably, the liquid is volatile, having a boiling point of no more than 200° C., no more than 150° C., or no more than 100° C.

In addition, the metal nanowire dispersion may contain additives and binders to control viscosity, corrosion, adhesion, and nanowire dispersion. Examples of suitable additives and binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene gylcol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., Zonyl® by DuPont).

In one example, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl® FSN, Zonyl® FSO, Zonyl® FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, and hydroxy ethyl cellulose. Examples of suitable solvents include water and isopropanol.

The nanowire concentration in the dispersion can affect or determine parameters such as thickness, conductivity (including surface conductivity), optical transparency, and mechanical properties of the nanowire network layer. The percentage of the solvent can be adjusted to provide a desired concentration of the nanowires in the dispersion. In preferred embodiments the relative ratios of the other ingredients, however, can remain the same. In particular, the ratio of the surfactant to the viscosity modifier is preferably in the range of about 80 to about 0.01; the ratio of the viscosity modifier to the metal nanowires is preferably in the range of about 5 to about 0.000625; and the ratio of the metal nanowires to the surfactant is preferably in the range of about 560 to about 5. The ratios of components of the dispersion may be modified depending on the substrate and the method of application used. The preferred viscosity range for the nanowire dispersion can be between about 1 and 100 cP.

Optionally, the substrate can be pre-treated to prepare a surface to better receive the subsequent deposition of the nanowires. Surface pre-treatments serve multiple functions. For example, they enable the deposition of a uniform nanowire dispersion layer. In addition, they can immobilize the nanowires on the substrate for subsequent processing steps. Moreover, the pre-treatment can be carried out in conjunction with a patterning step to create patterned deposition of the nanowires. Pre-treatments include solvent or chemical washing, heating, deposition of an optionally patterned intermediate layer to present an appropriate chemical or ionic state to the nanowire dispersion, as well as further surface treatments such as plasma treatment, UV-ozone treatment, or corona discharge.

Following the deposition, the liquid can be removed by evaporation. The evaporation can be accelerated by heating (e.g., baking, "annealing"). The resulting nanowire network layer may require post-treatment to render it electrically conductive. This post-treatment can be a process step involving exposure to heat, plasma, corona discharge, UV-ozone, or pressure as described below.

In certain embodiments, it is thus described herein a method of fabricating a transparent conductor comprising: depositing a plurality of metal nanowires on a substrate, the metal nanowires being dispersed in a fluid; forming a metal nanowire network layer on the substrate by allowing the fluid to dry, coating a matrix material on the metal nanowire network layer, and curing the matrix material to form a matrix.

"Matrix material" refers to a material or a mixture of materials that can cure into the matrix, as defined herein. "Cure", or "curing", refers to a process where monomers or partial polymers (fewer than 150 monomers) polymerize and/or cross-link so as to form a solid polymeric matrix. Suitable polymerization conditions are well known in the art and include by way of example, heating the monomer, irradiating the monomer with visible or ultraviolet (UV) light, electron beams, and the like. In addition, "solidification" of a polymer/solvent system simultaneously caused by solvent removal is also within the meaning of "curing".

The degree of curing can be controlled by selecting the initial concentrations of monomers and the amount of the cross-linkers. It can be further manipulated by adjusting curing parameters such as the time allowed for the polymerization and the temperature under which the polymerization takes place, and the like. In certain embodiments, the partially cured matrix can be quenched in order to arrest the curing process. The degree of curing or polymerization can be monitored, for example, by the molecular weight of the curing polymer or by the optical absorbance at wavelengths indicative of the reactive chemical species.

Thus, in certain embodiments, the matrix material comprises a polymer, which may be fully or partially cured. Optically clear polymers are known in the art.

In other embodiments, the matrix material comprises a prepolymer. A "prepolymer" refers to a mixture of monomers or a mixture of oligomers or partial polymers that can polymerize and/or crosslink to form the polymeric matrix, as described herein. It is within the knowledge of one skilled in the art to select, in view of a desirable polymeric matrix, a suitable monomer or partial polymer.

In some embodiments, the prepolymer is photo-curable, i.e., the prepolymer polymerizes and/or cross-links upon exposure to irradiation. In other embodiments, the prepolymer is thermal-curable.

Patterning and other process steps can be carried out as described in, for example, PCT publication WO 2008/046058 (Cambrios), including at, for example, pages 49-59 and associated figures and examples.

In preferred embodiments, matrix materials comprise sulfonated regioregular polythiophenes.

As described in U.S. patent application Ser. No. 11/871,761 "Nanowire-Based Transparent Conductors and Applications Thereof" filed Oct. 12, 2007 to Allemand et al., the transparent conductors can be fabricated by, for example, sheet coating, web-coating, printing, and lamination.

Another embodiment comprises use of slot die coating.

The ink formulations can be adapted for the deposition method, including use of slot die coating. For example, viscosity can be adapted, whether increased or decreased.

Hole Transport, Injection, or Collection Layers for Use with Nanowire-Based Electrodes In some embodiments, nanowire based electrodes are coated with a hole transport layer (HTL), hole collection layer (HCl), or hole injection layer (HIL). Suitable HTLs are less acidic and corrosive than PEDOT and are more compatible with nanowire based electrodes. In one embodiment, PEDOT materials are excluded. Preferred HTLs comprise one or more inherently conductive polymers (ICPs) or hole transporting materials (HTMs). Such HTLs can enable devices with nanowire based electrodes to perform similarly to devices using ITO electrodes. HTLs may include, in addition to the HTMs and/or ICPs, such components as planarizing agents, surfactants, dopants, solvents, and the like.

Hole Transport Materials

Hole transport materials (HTMs) are conductive or semiconductive materials that facilitate conduction of holes between adjacent layers typically electrode and emissive layers, or electrode and photoactive layer. HTMs can be organic or inorganic based materials. Examples of traditional organic based HTMs include heteroaryl amine compounds and polymers, including arylamines and/or doped arylamines, aryloxys, and organometallic complex moieties. Aryl amine moieties are known in the art. See, for example, Lim et al., *Organic Letter,* 2006, 8, 21, 4703-4706; Fukase et al., *Polymers for Advanced Technologies,* 13, 601-604 (2002). Shirota, Y. et al., *Chem Rev* 107, 2007, 953-1010; Z. Li and H. Meng, eds., *Organic Light-Emitting Materials and Devices,* CRC Press (Taylor an Francis Group, LLC), Boca Raton (2007) and references therein. The arylamine moieties can each comprise at least one nitrogen atom and at least one benzene ring. As a non-limiting example, they can comprise one benzene ring bonded to a nitrogen atom; two benzene rings bonded to a nitrogen atom; or three benzene rings bonded to a nitrogen atom; or three benzene rings bonded to a nitrogen atom. The repeat moiety can be adapted to provide hole injection and/or hole transport properties.

Examples of arylamines include but are not limited to triarylamines, bistriarylamines such as N,N-diphenylbenzeneamine. The aryl amine rings may be bonded to at least one other aryl ring through a direct covalent bond, or linked by a group comprising one or more carbon atoms, one or more oxygen atoms, or one or more halo atoms. For example the linking group can be at least one fluorinated alkyleneoxy group or a keto group.

Non-limiting examples of aryl amines and appropriate linking groups can be found in U.S. Provisional Applications 61/108,851, filed Oct. 27, 2008 to Seshadri et al. (see also US Publication No. 2010-0108954), and 61/115,877, filed Nov. 18, 2008 to Seshadri et al. (see also U.S. application Ser. No. 12/620,514 filed Nov. 17, 2009), each of which are incorporated by reference in their entireties.

ICP: Polythiophenes

Inherently conductive polymers are organic polymers that, due to their conjugated backbone structure, show high electrical conductivities under some conditions (relative to those of traditional polymeric materials). Performance of these materials as a conductor of holes or electrons is increased when they are doped, oxidized or reduced to form polarons and/or bipolarons. Electrically conductive polymers are described in *The Encyclopedia of Polymer Science and Engineering,* Wiley, 1990, pages 298-300, including polyacetylene, poly(p-phenylene), poly(p-phenylene sulfide), polyanilines, polypyrroles, polythiophenes, polyethylenedioxythiophenes, and poly(p-phenylene vinylene)s, and derivatives thereof, which is hereby incorporated by reference in its entirety. This reference also describes blending and copolymerization of polymers, including block copolymer formation.

Polythiophenes and derivatives of polythiophenes are examples of ICPs useful in the some embodiments. Polythiophenes are described, for example, in Roncali, J., *Chem. Rev.* 1992, 92, 711; Schopf et al., *Polythiophenes: Electrically Conductive Polymers,* Springer: Berlin, 1997. See also for example U.S. Pat. Nos. 4,737,557 and 4,909,959.

Regioregular Polythiophenes

Examples of ICPs also include regioregular polythiophenes. U.S. provisional patent application Ser. No. 60/832,095 "Sulfonation of Conducting Polymers and OLED and Photovoltaic Devices" filed Jul. 21, 2006 to Seshadri et al. is hereby incorporated by reference in its entirety including figures, working examples, and claims. In addition, U.S. provisional patent application Ser. No. 60/845,172 "Sulfonation of Conducting Polymers and OLED, Photovoltaic, and ESD Devices" filed Sep. 18, 2006 to Seshadri et al. is hereby incorporated by reference in its entirety including figures, working examples, and claims. U.S. patent application Ser. No. 11/826,394 (US Patent Publication 2008/0319207) "Sulfonation of Conducting Polymers and OLED, Photovoltaic, and ESD Devices" filed Jul. 13, 2007 to Seshadri et al. is hereby incorporated by reference in its entirety including figures, working examples, and claims.

Various terms are further described herein below:

"Alkyl" can be for example straight chain and branched monovalent alkyl groups having from 1 to 20 carbon atoms, or from 1 to 15 carbon atoms, or from 1 to 10, or from 1 to 5, or from 1 to 3 carbon atoms. This term is exemplified by groups such as for example methyl, ethyl, n-propyl, iso-propyl, n-butyl, t-butyl, n-pentyl, ethylhexyl, dodecyl, isopentyl, and the like.

"Optionally substituted" groups can be for example functional groups that may be substituted or unsubstituted by additional functional groups. For example, when a group is unsubstituted by an additional group it can be referred to as the group name, for example alkyl or aryl. When a group is substituted with additional functional groups it may more generically be referred to as substituted alkyl or substituted aryl.

"Substituted alkyl" can be for example an alkyl group having from 1 to 3, and preferably 1 to 2, substituents selected from the group consisting of alkyl, substituted alkyl, alkoxy, substituted alkoxy, aryl, substituted aryl, aryloxy, substituted aryloxy, hydroxyl.

"Aryl" can be for example a monovalent aromatic carbocyclic group of from 6 to 14 carbon atoms having a single ring (e.g., phenyl) or multiple condensed rings (e.g., naphthyl or anthryl) which condensed rings may or may not be aromatic provided that the point of attachment is at an aromatic carbon atom. Preferred aryls include phenyl, naphthyl, and the like.

"Substituted aryl" can be for example to an aryl group with from 1 to 5 substituents, or optionally from 1 to 3 substituents, or optionally from 1 to 2 substituents, selected from the group consisting of hydroxy, alkyl, substituted alkyl, alkoxy, substituted alkoxy, alkenyl, substituted alkenyl, substituted aryl, aryloxy, substituted aryloxy, and sulfonate "Alkoxy" can be for example the group "alkyl-O—" which includes, by way of example, methoxy, ethoxy, n-propyloxy, iso-propyloxy, n-butyloxy, t-butyloxy, n-pentyloxy, 1-ethyl-hex-1-yloxy, dodecyloxy, isopentyloxy, and the like.

"Substituted alkoxy" can be for example the group "substituted alkyl-O—."

"Alkylene" can be for example straight chain and branched divalent alkyl groups having from 1 to 20 carbon atoms, or from 1 to 15 carbon atoms, or from 1 to 10, or from 1 to 5, or from 1 to 3 carbon atoms. This term is exemplified by groups such as methylene, ethylene, n-propylene, iso-propylene, n-butylene, t-butylene, n-pentylene, ethylhexylene, dodecylene, isopentylene, and the like.

"Alkenyl" can be for example an alkenyl group preferably having from 2 to 6 carbon atoms and more preferably 2 to 4 carbon atoms and having at least 1 and preferably from 1-2 sites of alkenyl unsaturation. Such groups are exemplified by vinyl, allyl, but-3-en-1-yl, and the like.

"Substituted alkenyl" can be for example alkenyl groups having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic with the proviso that any hydroxyl substitution is not attached to a vinyl (unsaturated) carbon atom.

"Aryloxy" can be for example the group aryl-O— that includes, by way of example, phenoxy, naphthoxy, and the like.

"Substituted aryloxy" can be for example substituted aryl-O— groups.

"Alkylene oxide" or "alkyleneoxy" or "polyether" can be for example the group —O—(R$^a$—O)$_n$—R$^b$ where R$^a$ is alkylene and R$^b$ is alkyl or optionally substituted aryl and n is an integer from 1 to 6, or from 1 to 3. Alkylene oxide can be for example groups based on such as groups as ethylene oxides or propylene oxides.

In substituted groups described above, polymers arrived at by describing substituents with further substituents to themselves (e.g., substituted aryl having a substituted aryl group as a substituent which is itself substituted with a substituted aryl group, etc.) are not intended for inclusion herein. In such cases, the maximum number of such substituents is three. That is to say that each of the above descriptions can be constrained by a limitation that, for example, substituted aryl groups are limited to—substituted aryl-(substituted aryl)-substituted aryl.

Similarly, the above descriptions are not intended to include impermissible substitution patterns (e.g., methyl substituted with 5 fluoro groups or a hydroxyl group alpha to ethenylic or acetylenic unsaturation). Such impermissible substitution patterns are well known to the skilled artisan.

One skilled in the art can employ the following references in the practice of the various embodiments described herein. In particular, several references describe conducting polymers, polythiophenes, regioregular polythiophenes, substituted polythiophenes, and OLED, PLED, and PV devices prepared from them, and these can be used in the practice of one or more of the present embodiments. In reciting a conducting polymer name, the name can also include derivatives thereof. For example, polythiophene can include polythiophene derivatives.

In addition, provisional patent application Ser. No. 60/612,640 filed Sep. 24, 2004 to Williams et al. ("HETEROATOMIC REGIOREGULAR POLY(3-SUBSTITUTEDTHIOPHENES) FOR ELECTROLUMINESCENT DEVICES") and U.S. regular application Ser. No. 11/234,374 filed Sep. 26, 2005 are hereby incorporated by reference in their entirety including the description of the polymers, the figures, and the claims.

Provisional patent application Ser. No. 60/612,641 filed Sep. 24, 2004 to Williams et al. ("HETEROATOMIC REGIOREGULAR POLY (3-SUBSTITUTEDTHIOPHENES) FOR PHOTOVOLTAIC CELLS") and U.S. application Ser. No. 11/234,373 filed Sep. 26, 2005 are hereby incorporated by reference in their entirety including the description of the polymers, the figures, and the claims.

The U.S. application Ser. No. 11/350,271, to Williams et al, can be also used to practice the various embodiments described herein for hole injection and transport layers ("HOLE INJECTION/TRANSPORT LAYER COMPOSITIONS AND DEVICES"). Another reference which can be used is Williams et al, Ser. No. 11/376,550, COPOLYMERS OF SOLUBLE POLYTHIOPHENE WITH IMPROVED ELECTRONIC PERFORMANCE, filed Mar. 16, 2006.

Polythiophenes can be homopolymers, copolymers, or block copolymers. Synthetic methods, doping, and polymer characterization, including regioregular polythiophenes with side groups, is provided in, for example, U.S. Pat. Nos. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, 2$^{nd}$ Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and -(AB)$_n$- multiblock copolymers (chapter 7), which can form the basis of block copolymer types in some embodiments.

Additional block copolymers including polythiophenes are described in, for example, Francois et al., *Synth. Met.* 1995, 69, 463-466, which is incorporated by reference in its entirety; Yang et al., *Macromolecules* 1993, 26, 1188-1190; Widawski et al., *Nature (London)*, vol. 369, Jun. 2, 1994, 387-389; Jenekhe et al., Science, 279, Mar. 20, 1998, 1903-1907; Wang et al., *J. Am. Chem. Soc.* 2000, 122, 6855-6861; Li et al., Macromolecules 1999, 32, 3034-3044; Hempenius et al., *J. Am. Chem. Soc.* 1998, 120, 2798-2804;

The following article describes several types of regioregular systems beginning at page 97 and references cited therein: "The Chemistry of Conducting Polythiophenes," by Richard D. McCullough, *Adv. Mater.* 1998, 10, No. 2, pages 93-116. In a regioregular polymer, including a polythiophene, the degree of regioregularity can be, for example, about 90% or more, or about 95% or more, or about 98% or more, or about 99% or more. Methods known in the art such as, for example, NMR can be used to measure the degree of regioregularity. Regioregularity can arise in multiple ways. For example, it can arise from polymerization of asymmetric monomers such as a 3-alkylthiophene to provide head-to-tail (HT) poly(3-substituted)thiophene. Alternatively, it can arise from polymerization of monomers which have a plane of symmetry between two portions of monomer such as for example a bi-thiophene, providing for example regioregular HH-TT and TT-HH poly(3-substituted thiophenes).

In particular, substituents which can be used to solubilize conducting polymers with side chains include alkoxy and alkyl including for example C1 to C25 groups, as well as heteroatom systems which include for example oxygen and nitrogen. In particular, substituents having at least three carbon atoms, or at least five carbon atoms can be used. Mixed substituents can be used. The substituents can be nonpolar, polar or functional organic substituents. The side group can be called a substituent R which can be for example alkyl, perhaloalkyl, vinyl, acetylenic, alkoxy, aryloxy, vinyloxy, thioalkyl, thioaryl, ketyl, thioketyl, and optionally can be substituted with atoms other than hydrogen.

Thiophene polymers can be star shaped polymers with the number of branches being for example more than three and comprising thiophene units. Thiophene polymers can be dendrimers. See for example Anthopoulos et al., Applied Physics Letters, 82, 26, Jun. 30, 2003, 4824-4826, and further description of dendrimers hereinafter.

Heterocyclic polymers are particularly preferred. A particularly preferred system is the polythiophene system and the regioregular polythiophene system. Polymers can be obtained from Plextronics, Inc., Pittsburgh, Pa. including for example polythiophene-based polymers such as for example Plexcore, Plexcoat, and similar materials.

Another embodiment includes heterocyclic conjugated polymers which are relatively regioirregular. For example, the degree of regioregularity can be about 90% or less, or about 80% or less, or about 70% or less, or about 60% or less, or about 50% or less.

Sulfonation of Polymers

Polymers including the aforementioned polymers can be subjected to sulfonation. Sulfonation schemes are known in the art for different conducting polymers and heterocyclic types of conducting polymers, including those which have a heterocyclic atom such as S, N, Se, Te, and Si. The organic based substituents on the sulfonated polythiophenes are not particularly limited but can be, for example, a group which provides a solubilizing function such as alkyl or alkoxy.

Polythiophene systems comprising sulfonate groups are known. For example, some embodiments provide a composition comprising: a water soluble or water dispersible regioregular polythiophene comprising (i) at least one organic substituent, and (ii) at least one sulfonated substituent comprising sulfur bonding directly to the polythiophene backbone.

When a regioregular polymer is subjected to sulfonation, the polymer composition can be yet called regioregular for present purposes.

Additional Polymer Embodiments

In addition, an embodiment for the polymer which can be subjected to sulfonation to produce sulfonated substituents on the polymer backbone can be represented by formula (I),

(I)

wherein R can be optionally substituted alkyl, optionally substituted alkoxy, and optionally substituted aryloxy. Examples of substituents for the optional substitution include hydroxyl, phenyl, and additional optionally substituted alkoxy groups. The alkoxy groups can be in turn optionally substituted with hydroxyl, phenyl, or alkoxy groups; or wherein R can be an optionally substituted alkylene oxide. Substituents can be for example hydroxyl, phenyl, or alkoxy groups; or wherein R can be optionally substituted ethylene oxide or optionally substituted propylene oxide or other lower alkyleneoxy units. Substituents can be for example hydroxyl, phenyl, or alkoxy groups; or R can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy.

In addition, the substituent group R in (I) can be linked to the thiophene by an oxygen atom as alkoxy or phenoxy, wherein the substituent can be characterized by the corresponding alcohol or phenol, respectively. The alcohol, for example, can be linear or branched, and can have C2-C20, or C4-C18, or C6 to C14 carbon atoms. The alcohol can be for example an alkyl alcohol, or an ethylene glycol, or a propylene glycol, or a diethylene glycol, or a dipropylene glycol, or a tripropylene glycol. Additional examples can be monoethylene glycol ethers and acetates, diethylene glycol ethers and acetates, triethylene glycol ethers and acetates, and the like. Examples of alcohols which can be linked to the thiophene ring through the oxygen atom include hexyl cellosolve, Dowanol PnB, ethyl carbitol, Dowanol DPnB, phenyl carbitol, butyl cellosolve, butyl carbitol, Dowanol DPM, diisobutyl carbinol, 2-ethylhexyl alcohol, methyl isobutyl carbinol, Dowanol Eph, Dowanol PnP, Dowanol PPh, propyl carbitol, hexyl carbitol, 2-ethylhexyl carbitol, Dowanol DPnP, Dowanol TPM, methyl carbitol, Dowanol TPnB. Trade names are well known in this art. See for example DOW P-series and E-series glycol ethers.

The structure shown in (I) can stand alone as a polymer or it can be part of a block copolymer with another segment.

Molecular weights can be, for example, 25-5,000, or 50-1,000;

In some embodiments, compositions comprising 3,4-disubstituted polythiophenes and redox dopants may be employed in the HIL compositions, as described in U.S. Provisional Applications 61/044,380, filed Apr. 11, 2008 to Brown et al, and 61/119,239, filed Dec. 2, 2008 to Brown et al., as well as U.S. application Ser. No. 12/422,159, filed Apr. 10, 2009 to Seshadri et al., all of which are incorporated by reference in their entireties.

Formulation and Blending

Other components can be used to help provide needed properties, such as planarization, for the hole injection or hole transport layers. For example, planarizing agents, when blended with the hole injection component, will facilitate the formation of the hole injection layer (HIL), hole transport layer (HTL), or hole collection layer (HCL) in a device such as an OLED or PV device. It will also be soluble in the solvent that is used to apply the HIL system. (Note that we use the term "HIL" in this application to refer to any of the terms HIL, HTL, or HCL generically, where a specific device or device configuration does not require use of one of the specific terms.)

More than one non-conductive polymer can be used in the formulation.

Additional planarizing agents useful in the HIL compositions are detailed in the following applications, each of which is incorporated herein by reference in their entirety. U.S. Provisional Applications 61/108,844 filed on Oct. 27, 2008 titled "CHARGE INJECTION AND TRANSPORTING LAYER COMPRISING A CONDUCTIVE POLYMER MIXED WITH A SEMICONDUCTING POLYMER FOR USE IN ELECTRONIC DEVICES." U.S. Provisional Applications 61/034,476 filed on Mar. 6, 2008 and U.S. patent application Ser. No. 12/399,006 filed on Mar. 5, 2009 each titled "MODIFIED PLANARIZING AGENTS AND DEVICES." U.S. Provisional Applications 61/032,905 filed on Feb. 29, 2008 and U.S. patent application Ser. No. 12/395,327 filed on Feb. 27, 2009 each titled PLANARIZING AGENTS AND DEVICES. In some embodiments, the planarizing agent and the hole injection component could be represented by a copolymer that contains an ICP segment and a non-conjugated segment with a composition like similar to that described herein.

In some embodiments, the planarizing agent can also be a "non-fugitive", small molecule that is soluble in the application solvent, but does not evaporate upon removal of the solvent. It may possess alkyl, aryl, or functional alkyl or aryl character.

In addition to facilitating the providing of a smooth surface to the HIL layer, the other components can also provide other useful functions such as resistivity control and transparency control. Planarity can be determined by methods known in the art including AFM measurements.

The solvent system, or solvents for dispersing polymers, can be a mixture of water and organic solvent, including water miscible solvents, and solvents that comprise oxygen, carbon, and hydrogen, such as for example an alcohol or an etheric alcohol. Additional examples of water miscible solvents include alcohols such as isopropanol, ethanol, and methanol, and ethylene glycols and propylene glycols from Dow Chemical and Eastman Chemical. See for example Cellosolve, Carbitol, propane diol, methyl carbitol, butyl cellosolve, Dowanol PM, In some embodiments, the amount of water can be greater than the amount of organic solvent. A wide variety of combination of solvents can be used including non-aqueous including alcohols and other polar solvents. The composition can comprise a first solvent and a second solvent, different than the first solvent.

In particular, water soluble resins and aqueous dispersions can be used. Aqueous dispersions can be for example poly (styrene sulfonic acid) (i.e. PSS dispersion), Nafion dispersion (e.g., sulfonated fluorinated polymers), latex, and polyurethane dispersions. Examples of water soluble polymers include polyvinylpyrollidinone and polyvinylalcohol. Other examples of resins include cellulose acetate resins (CA, CAB, CAP—Eastman).

Surfactants can be used including for example ionic and non-ionic surfactants, as well as polymer surfactants, fluorinated surfactants, and ionomers.

Resins and HIL inks can be dispersed and/or dissolved by any method known in the art including for example sonication.

If desired, the formulation can be formulated to include crosslinking agents which provide crosslinked structures which may swell but not dissolve upon crosslinking.

Optionally, additional ingredients can be mixed in including for example a second type of polymer.

In some embodiments, the HIL system can be applied by spin casting, drop casting, dip-coating, spray-coating, inkjetting, gravure coating, doctor blading, and the like.

The HIL film in some embodiments can be provided that is about 10 nm to about 50 $\mu$m in thickness with typical thickness ranging from about 50 nm to about 1 $\mu$m. In another embodiment, thickness can be about 10 nm to about 500 nm, and more particularly, about 10 nm to about 100 nm.

Good surface smoothness and interfacial properties are important.

In one embodiment, a composition such as an HTL, HCL, or HIL composition does not comprise PEDOT or PEDOT: PSS.

Devices

In some embodiments, coated electrodes can be used in various organic based electronic devices, for example in multilayered structures which can be prepared by for example solution processing or vacuum deposition, as well as printing and patterning processes, or combinations thereof. In particular, the embodiments described herein are useful for solution process depositions of anodes for organic electronic devices, e.g. OPVs and OLEDs.

For example, photovoltaic devices are known in the art. The devices can comprise, for example, multi-layer structures including for example coated anodes; optionally additional hole injection or hole transport layers; a P/N bulk heterojunction layer; a conditioning layer such as LiF; and a cathode such as for example Ca, Al, or Ba. Devices can be adapted to allow for current density versus voltage measurements. Inverted structures can be made.

A variety of photoactive layers can be used in OPV devices. Photovoltaic devices can be prepared with photoactive layers comprising fullerene derivatives mixed with for example conducting polymers as described in for example U.S. Pat. Nos. 5,454,880 (Univ. Cal.); 6,812,399; and 6,933,436. Photovoltaic devices can be prepared with photoactive bulk heterojunctions using materials described in the following US patent applications: U.S. Provisional Patent Application 60/812,961 filed on Jun. 13, 2006, U.S. patent application Ser. No. 11/743,587 filed on May 2, 2007 and U.S. patent application Ser. No. 12/040,776 filed on Feb. 29, 2008. Fullerene derivatives including derivatives comprising indene, or the PCBM fullerene derivative, can be used as an n-type material.

Common cathode materials and substrates, as well as encapsulating materials can be used.

Similarly, OLED devices are known in the art. The devices can comprise, for example, multi-layer structures including for example coated anodes; optionally additional hole injection or hole transport layers; an electroluminescent layer such as a polymer layer; a conditioning layer such as LiF, and a cathode such as for example Ca, Al, or Ba.

Methods known in the art can be used to fabricate devices including for example OLED and OPV devices. Methods known in the art can be used to measure brightness, efficiency, and lifetimes. OLED patents include for example U.S. Pat. Nos. 4,356,429 and 4,539,507 (Kodak). Conducting polymers which emit light are described in for example U.S. Pat. Nos. 5,247,190 and 5,401,827 (Cambridge Display Technologies). See also Kraft et al., "Electroluminescent Conjugated Polymers—Seeing Polymers in a New Light," Angew. Chem. Int. Ed., 1998, 37, 402-428, including device architecture, physical principles, solution processing, multilayering, blends, and materials synthesis and formulation, which is hereby incorporated by reference in its entirety.

Light emitters known in the art and commercially available can be used including various conducting polymers as well as organic molecules, such as materials available from Sumation, Merck Yellow, Merck Blue, American Dye Sources (ADS), Kodak (e.g, AlQ3 and the like), and even Aldrich such as BEHP-PPV. Examples of such organic electroluminescent materials include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), polyp-phenylene-2,6-benzimidazole), and their derivatives.

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato) aluminum (Alq); (ii) 1,3-bis(N,N-dimethylaminophenyl)-1,3,4-oxidazole (OXD-8); (iii)-oxo-bis(2-methyl-8-quinolinato)aluminum; (iv) bis (2-methyl-8-hydroxyquinolinato) aluminum; (v) bis(hydroxybenzoquinolinato) beryllium ($BeQ_{sub2}$); (vi) bis (diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687 issued to VanSlyke; and Bredas, J.-L., Silbey, R., eds., Conjugated Polymers, Kluwer Academic Press, Dordrecht (1991).

Common electrode materials and substrates, as well as encapsulating materials can be used.

OLED Testing

Methods known in the art can be used to measure OLED parameters. For example, measurements can be carried out at 10 $mA/cm^2$.

Voltage can be for example about 2 to about 8, or about 3 to about 7 including for example about 2 to about 5.

Brightness can be, for example, at least 250 $cd/m^2$, or at least 500 $cd/m^2$, or at least 750 $cd/m^2$, or at least 1,000 $cd/m^2$.

Efficiency can be, for example, at least 0.25 Cd/A, or at least 0.45 Cd/A, or at least 0.60 Cd/A, or at least 0.70 Cd/A, or at least 1.00 Cd/A, or at least 2.5 Cd/A, or at least 5.00 Cd/A, or at least 7.50 Cd/A, or at least 10.00 Cd/A.

Lifetime can be measured at 50 $mA/cm^2$ in hours and can be, for example, at least 50 hours, or at least 100 hours, or at least about 900 hours, or at least 1,000 hours, or at least 1100 hours, or at least 2,000 hours, or at least 5,000 hours.

Combinations of brightness, efficiency, and lifetime can be achieved. For example, brightness can be at least 1,000 $cd/m^2$, efficiency can be at least 1.00 Cd/A, and lifetime can be at least 1,000 hours, at least 2,500 hours, or at least 5,000 hours.

OPV Testing

Methods known in the art can be used to measure OPV parameters.

$J_{SC}$ values ($mA/cm^2$) can be for example at least 6, or at least 7, or at least 8, or at least 9, or at least 10, or at least 11, or at least 12. The values can be for example about 5 to about 12, or about 5 to about 15, or about 5 to about 20.

$V_{OC}$ values (V) can be for example at least about 0.5, or at least about 0.6, or at least about 0.7, or at least about 0.8, or at least about 0.9, or at least about 1.0, including for example about 0.5 to about 1.0, or about 0.55 to about 0.65.

FF values can for example at least about 0.2, or at least about 0.3, or at least about 0.4, or at least about 0.5, or at least about 0.6, or at least about 0.7, including also for example about 0.5 to about 0.8, or about 0.5 to about 0.73.

η (%) values can be for example at least about 1%, or at least about 2%, or at least about 3%, or at least about 4%, or at least about 5%, or at least about 6%, or at least about 7%, including for example about 1% to about 8%, or about 1% to about 7%, or about 1% to about 6%, or about 1% to about 5%, or about 1% to about 3.4%, or about 2% to about 3.4%.

Sulfonated polymers and formulations thereof as described herein can be made into an ink that can be used to produce high-performance hole-extraction or hole collection layer for organic photovoltaic devices.

Control materials can be formulated such as PEDOT materials described in U.S. Pat. No. 4,959,430 to Jonas et al. Baytron materials can be obtained from H.C. Stark.

19

Degradation rate and degradation time for a cell can also be examined.

Inverted solar devices can be made. Roll-to-roll processing can be carried out. Solar modules can be prepared. See, for example, Sun and Sariciftci, *Organic Photovoltaics*, 2005.

Additional description is provided with use of the following non-limiting working examples.

WORKING EXAMPLES

Example 1

Preparation of Patterned Silver Nanowires Disposed on Substrate

Aqueous coating solution available from Cambrios Technologies Corporation was prepared containing silver nanowires, Hydroxypropyl methyl cellulose (HPMC), Triton X-100, and water. Clean Eagle 2000 glass supplied by Coresix Precision Glass Inc. was used to prepare silver coated glass substrates. The Glass was 152.4 mm by 152.4 mm in size. The Glass was pretreated by using UV Ozone for 10 minutes. Spin coater Model # PWM32-PS-CB15PL from Headway Research Inc. was used to prepare the substrates. A recessed chuck was used to obtain uniform coatings. 10 ml of the coating solution was dispensed on the glass substrate on the spinner spinning at 500 rpm for 60 seconds. The coating was then dried at 50° C. for 2 minutes in a convection oven and baked at 180° C. for 90-120 seconds on a hot plate. The coating was measured to have a sheet resistance of 15-17 ohms/sq (as measured by Delcom 717B Conductance Monitor) with a transmission of 95% transmission with a haze of 3% as measured by Haze Gard Plus.

To pattern the silver coating, the following procedure was used. AZ® 3330F product of AZ Electronic Material was used as photoresist. A layer of photoresist was spun on the silver coating at a spin speed of 2000 rpm for 60 seconds. The photoresist was pre-baked at 110 for 3 minutes on a hotplate. A film mask was used for exposure @220 mJ energy. The photoresist was then post baked for 60 seconds. AZ® 300 MIF developer was used for 30-60 seconds to develop the resist material. Transene Aluminium Etchant Type A was used as etchant for the silver nanowires. A DI water wash step was involved after the develop and etch step. Propylene Glycol Monomethyl Ether (PGME) was used to strip the photoresist.

Example 2

Coating Silver Nanowire Substrates with PLEXCORE OC HIL a Formulation

The patterned silver coatings as described in Example 1 were coated with HIL material as prepared in Example 5, which resulted in non uniform hazy film on top of the coating of silver nanowires. The HIL was diluted 3 parts to 2 parts methanol by weight. This diluted formulation was spun coated on the patterned film of Example 1 at 1000 rpm for 30 seconds. This was followed by a dry step at 50° C. for 5 minutes and a bake at 160° C. for 25-30 minutes. This resulted in a 70-80 nm coating as measured by a surface profilometry tool. The combined transmission of the conductive coating and the HIL top coating was measured at 86% for film only.

Example 3

Preparation of Active Layer Inks

PLEXCORE P3HT was prepared as described in US Patent Publication 2008/0319207. Inks were prepared from P3HT

20 and fullerene derivatives by adding 542 mg of the solids to 23.5 g 1,2-dichlorobenzene. The inks were stirred for 2 hours at approximately 60° C., then allowed to cool.

Example 4

Preparation of sulfonated poly(3-(methoxyethoxyethoxy)thiophene-2,5-diyl) (PLEXCORE MPX)

A 0.7% aqueous dispersion of sulfonated poly(3-(methoxyethoxyethoxy)thiophene-2,5-diyl) was prepared as described in US Patent Publication 2008/0248313.

Example 5

Preparation of Four HIL Formulations (1) A pH 3 HIL formulation was prepared by adding 5.4 g of poly(4-vinylphenol) (DuPont or Sigma-Aldrich) to a container containing 127.2 g 1,2-propanediol and 110.0 g isopropanol. The mixture was stirred until all of the solids dissolved. To this solution was added 1.7 g of poly(styrene sulfonate) 18% aqueous solution (Sigma-Aldrich) with stirring. 100.8 g PLEXCORE MPX 0.7% aqueous solution was then added dropwise with stirring. 4.9 g of water was then added, followed by 0.3 g SURFYNOL® 104PA surfactant (50 wt % 2,4,7,9-tetramethyl-5-decyne-4,7-diol in 2-propanol, Air Products), both with stirring until the formulation was homogeneous.

(2) A pH 5 HIL formulation was prepared by adding dimethylethanolamine (Sigma-Aldrich) dropwise to the pH3 HIL formulation until pH 5 was achieved (approximately 5 drops).

(3) A PLEXCORE OC HIL A formulation was prepared by adding 3.2 g of poly(4-vinylphenol) (DuPont or Sigma-Aldrich) to a container containing 49.0 g of 1,2-propanediol and 39.2 g of isopropanol. The mixture was stirred until all of the solids dissolved. To this solution was added 0.2 g of poly (styrene sulfonate) 18% aqueous solution (Sigma-Aldrich), followed by 1.2 g of 10% aqueous dispersion NAFION perfluorinated resin (Sigma Aldrich) with stirring. 104.5 g PLEXCORE MPX 0.7% aqueous solution dropwise with stirring. 2.8 g of water was then added and the formulation stirred until homogeneous.

(4) A PLEXCORE OC HIL B formulation was prepared by adding 0.9 g of poly(4-vinylphenol) (DuPont or Sigma-Aldrich) to 17.2 g of 2-butoxyethanol (Sigma-Aldrich). The mixture was stirred until all of the solids dissolved. To this solution was added 9.5 g PLEXCORE MPX 0.7% aqueous solution dropwise with stirring. 22.4 g of water was then added and the formulation stirred until homogeneous.

Example 6

OPV Devices Made from PEDOT/PSS HIL and Soap Washes

Silver nanowire substrates of Example 1 were cleaned in a Class 10,000 clean room by sonicating for 20 min in a soap solution (Deconoex OP 162, Borer, 1 drop per litre deionized water), followed by 20 min of sonication in water, followed by 20 min of sonication in acetone. The substrates were then exposed to UV and ozone for 10 min.

After cleaning, substrates were coated with a hole injection layer (HIL) comprising an approximately 30 nm thick layer of a poly(3,4-ethylenedioxythiophene)-poly(styrenesulfonate) (PEDOT/PSS) aqueous dispersion (BAYTRON®

AI 4083 from H.C. Starck) by spin coating in air for 5 sec at 400 rpm, followed by 1 min at 6000 rpm. The coated substrates were then annealed for 30 min on a 175 C hot plate in a nitrogen atmosphere.

In a dry box, the active layer inks of Example 3 were spin-coated over the HIL-coated substrates for 3 min at 350 rpm in a nitrogen atmosphere. The coated substrates were then annealed for 30 min on a 175 C hot plate in a nitrogen atmosphere. After annealing, the cathode was applied on top of the active layer by first vapor depositing an approximately 10 nm thick Ca layer and then vapor depositing an approximately 200 nm thick Al layer. The devices were then encapsulated with a glass cover slip that was sealed with a UV-curable adhesive (EPO-TEK® OG112-4 from Epoxy Technology) and cured under UV radiation for 4 min at 80 mW/cm² intensity. The contact pads were then wiped with isopropyl alcohol to remove the organic layer from the electrode.

Each encapsulated device comprised light-sensitive pixels on the substrate whose electrodes extend outside the encapsulated region of the device. The typical area of each pixel was 0.09 cm². The photovoltaic characteristics of the devices were measured using a system equipped with a Keithly 2400 source meter and an Oriel 300W Solar Simulator, based on a Xe lamp with 100 mW/cm² output intensity, using an Air Mass 1.5 global spectral filter, which approximates the Sun's spectrum. The lamp intensity was calibrated using an NREL-certified Si—KG5 silicon photodiode.

The source meter supplied a bias voltage that was applied to the silver nanowire electrode, while the aluminum electrode was grounded. The resulting photocurrent was measured as a function of the bias voltage applied to each pixel. The power conversion efficiency of a solar cell was determined for four pixels per device as $\eta=(FF|Jsc|Voc)/Pin$, where FF is the fill factor, Jsc is the current density at short circuit, Voc is the photovoltage at open circuit, and Pin is the incident light power density, with "Best η" being the best efficiency measured among the four pixels. Results are summarized in Table 1.

TABLE 1

| Experiment and Device #s | Jsc | Voc(V) | FF | η (%) | Best η |
|---|---|---|---|---|---|
| 6-1 (control)* | 9.88 | 0.60 | 0.54 | 3.27 | 3.66 |
| 6-2 | 2.51 | 0.09 | 0.25 | 0.06 | 0.08 |
| 6-3 | 2.56 | 0.10 | 0.25 | 0.07 | 0.08 |
| 6-4 | 2.89 | 0.12 | 0.26 | 0.09 | 0.13 |
| 6-5 | 3.30 | 0.16 | 0.26 | 0.14 | 0.17 |

*control device is glass/ITO/PEDOT/active layer/Ca:Al/glass

Example 7

OPV Devices Made from PEDOT/PSS HIL and Isopropyl Alcohol Washes

The procedure of Example 6 was used, except for the substitution of isopropyl alcohol for soap solution during sonication. Results of device testing are summarized in Table 2.

TABLE 2

| Experiment and Device #s | Jsc | Voc(V) | FF | η (%) | Best η |
|---|---|---|---|---|---|
| 7-1 (control)* | 10.36 | 0.61 | 0.58 | 3.44 | 3.76 |
| 7-2 | 6.95E−04 | 0.51 | 0.23 | 8.26E−05 | 1.02E−04 |
| 7-3 | 7.78E−04 | 0.52 | 0.23 | 9.51E−05 | 1.33E−04 |
| 7-4 | 6.39E−04 | 0.49 | 0.24 | 7.52E−05 | 1.17E−04 |
| 7-5 | 8.30E−04 | 0.53 | 0.23 | 1.01E−04 | 1.30E−04 |
| 7-6 | 2.29E−03 | 0.58 | 0.24 | 3.21E−04 | 3.63E−04 |

*control device is glass/ITO/PEDOT/active layer/Ca:Al/glass

Example 8

OPV Devices Made from pH3 and pH5 HILs and Using Isopropyl Alcohol Pad Cleaning

The pH 3 and pH 5 HIL-coated nano-wire substrates were cleaned in a Class 10,000 clean room by blowing with compressed, dry, particle-free nitrogen.

In a dry box, the active layer inks of Example 3 were spin-coated over the HIL-coated substrates for 3 min at 350 rpm in a nitrogen atmosphere. The coated substrates were then annealed for 30 min on a 175° C. hot plate in a nitrogen atmosphere. After annealing, the cathode was applied on top of the active layer by first vapor depositing an approximately 10 nm thick Ca layer and then vapor depositing an approximately 200 nm thick Al layer. The devices were then encapsulated with a glass cover slip that was sealed with a UV-curable adhesive (EPO-TEK® OG112-4 from Epoxy Technology) and cured under UV radiation for 4 min at 80 mW/cm² intensity. The contact pads were then wiped with isopropyl alcohol to remove the organic layer from the electrode. Results of device testing are summarized in Table 4.

TABLE 4

| Experiment and Device #s | Jsc | Voc(V) | FF | η (%) | Best η |
|---|---|---|---|---|---|
| 8-1 (control)* | 6.43 | 0.51 | 0.54 | 1.86 | 2.70 |
| 8-2 pH 3 | 6.03 | 0.55 | 0.55 | 1.83 | 1.90 |
| 8-3 pH 3 | 5.69 | 0.55 | 0.58 | 1.82 | 1.91 |
| 8-4 pH 5 | 5.61 | 0.55 | 0.55 | 1.68 | 1.75 |
| 8-5 pH 5 | 5.64 | 0.55 | 0.55 | 1.72 | 1.74 |

*control device is glass/ITO/PEDOT/active layer/Ca:Al/glass

Example 9

OPV Devices Made from pH3 and pH5 HILs and Using Toluene Pad Cleaning

The procedure of Example 8 was used, except for the substitution of toluene (anhydrous, Sigma-Aldrich) for isopropyl alcohol in removing organic layers to make connections to the electrode. Results of device testing are summarized in Table 5.

TABLE 5

| Experiment and Device #s | Jsc | Voc(V) | FF | η (%) | Best η |
|---|---|---|---|---|---|
| 9-1 (control)* | 10.08 | 0.61 | 0.60 | 3.71 | 3.77 |
| 9-2 pH 5 | 9.84 | 0.60 | 0.49 | 2.87 | 3.02 |
| 9-3 pH 5 | 9.65 | 0.60 | 0.46 | 2.70 | 2.92 |
| 9-4 pH 5 | 9.44 | 0.55 | 0.38 | 1.96 | 2.10 |
| 9-5 pH 5 | 9.36 | 0.60 | 0.44 | 2.46 | 2.63 |

TABLE 5-continued

| Experiment and Device #s | Jsc | Voc(V) | FF | η (%) | Best η |
|---|---|---|---|---|---|
| 9-8 pH 3 | 8.55 | 0.85 | 0.51 | 3.66 | 3.79 |
| 9-9 pH 3 | 8.45 | 0.85 | 0.54 | 3.86 | 3.92 |

*control device is glass/ITO/PEDOT/active layer/Ca:Al/glass

Example 10

OPV Devices Made from PLEXCORE OC HIL B and Using Toluene Pad Cleaning

The procedure of Example 9 was used, except for the substitution of PLEXCORE OC HIL B of Example 5 for the pH 3 and pH 5 HILs. Results of device testing are summarized in Table 6.

TABLE 6

| Experiment and Device #s | Jsc | Voc(V) | FF | η (%) | Best η |
|---|---|---|---|---|---|
| 10-1 (control)* | 9.58 | 0.61 | 0.62 | 3.63 | 3.69 |
| 10-2 HIL | 9.48 | 0.60 | 0.58 | 3.32 | 3.37 |
| 10-3 HIL | 9.21 | 0.60 | 0.58 | 3.20 | 3.28 |
| 10-4 HIL | 9.48 | 0.60 | 0.58 | 3.32 | 3.46 |
| 10-5 HIL | 9.64 | 0.61 | 0.58 | 3.38 | 3.48 |

*control device is glass/ITO/PEDOT/active layer/Ca:Al/glass

Example 11

OLED Devices Made from pH5 HIL and Optionally PLEXCORE OC HIL B pH5-coated substrates of Example 2 were cleaned in a Class 10,000 clean room by blowing with compressed, dry, particle-free nitrogen.

The PLEXCORE OC HIL B formulation of Example 5 was spin-coated over some of the pH5-coated substrates for 5 sec at 350 rpm, followed by 40 sec at 600 rpm. The PLEXCORE OC HIL B-coated substrates were then annealed for 15 min at 175° C. in a nitrogen atmosphere. This resulted in an approximately 60 nm layer on the coated devices.

Over either the cleaned pH5-coated substrates or the PLECORE OC HIL B-coated substrates, an interlayer was applied, also in a dry box. The approximately 15 nm interlayer was spin-coated for 4 sec at 300 rpm, followed by 6 sec at 2000 rpm, in a nitrogen atmosphere, followed by drying for 30 sec at 400 rpm. The interlayer-coated substrates were then annealed for 60 min at 180° C. in a nitrogen atmosphere.

Next, an emissive layer was applied over the interlayer, also in a dry box. The approximately 58 nm emissive layer was spin-coated for 4 sec at 400 rpm, followed by 6 sec at 5500 rpm, in a nitrogen atmosphere, followed by drying for 30 sec at 400 rpm. The emissive layer-coated substrates were then annealed for 10 min at 130° C. in a nitrogen atmosphere.

After annealing, the cathode was applied on top of the emissive layer by first vapor depositing an approximately 5 nm thick Ba layer and then vapor depositing an approximately 200 nm thick Al layer. The devices were then encapsulated with a getter and a glass cover slip that was sealed with an epoxy adhesive (Delo GmbH). Table 7 summarizes the devices that were constructed.

TABLE 7

| Experiment and Device # | Layer 1 | Layer 2 | Layer 3 | Layer 4 | Layer 5 | Layer 6 |
|---|---|---|---|---|---|---|
| 11-1 | pH 5 HIL | (none) | interlayer | emissive layer | Ba | Al |
| 11-2 | pH 5 HIL | (none) | interlayer | emissive layer | Ba | Al |
| 11-3 | pH 5 HIL | Plexcore OC HIL B | interlayer | emissive layer | Ba | Al |
| 11-4 | pH 5 HIL | Plexcore OC HIL B | interlayer | emissive layer | Ba | Al |

The devices were then tested at a fixed current density (30 mA/cm2). The voltage, efficiency, and color coordinates were measured using a photoresearch camera (PR-670). Results of device testing are summarized in Table 8.

TABLE 8

| Device | CIEy | Cd/A (Efficiency) | Voltage (V) |
|---|---|---|---|
| Average of 11-1 and 11-2 | 0.22 | 5.18 | 9.36 |
| Average of 11-3 and 11-4 | 0.23 | 3.65 | 8.41 |

ADDITIONAL WORKING EXAMPLES

Example 12

Preparation of Patterned Silver Nanowires Disposed on Substrate Using Slot-Die Coater Special aqueous coating solution suitable for slot-die coating processes was supplied by Cambrios Technologies Corporation. This solution included silver nanowires, hydroxypropyl methyl cellulose (HPMC), Triton X-100, and water. 1.1 mm thick glass (Corning 7059) supplied by Precision Glass & Optics, Inc. was used to prepare silver coated glass substrates. The glass was 152.2 mm by 152.2 mm in size. The glass was first cleaned in ultrasonically agitated 2% solution of DI water and Detergent 8 (by Alconox) for 15 min, followed by ultrasonically agitated DI water (17.5 MΩ) for 15 min, followed by rinse/dry cycles in Spin Rinse Dryer Semitool (Model 280S), Program 1. Prior to application of the nanowire solution, the clean glass was pretreated in UV Ozone cleaner (by Jelight, Model 144AX) for 5 minutes. The solution was applied on glass substrate by slot die coater NexTech FAS (Model Advantage II) using following parameters:

| | | | |
|---|---|---|---|
| Priming Rate | 60 μL/s | Priming Duration: | 10 s |
| Priming Gap: | 75 μm | | |
| Coating Gap: | 100 μm | Dispense Rate: | 70 μL/s |
| Head Speed: | 10 mm/s | | |

The coating was then dried at 50° C. for 2 minutes in a convection oven and baked at 180° C. for 90-120 seconds on a hot plate. The coating was measured by handheld 4-point probe RCheck+ (by Electronic Design to Market, Inc., Model RC 3175) to have a sheet resistance of 7-9 ohms/sq with a transmission of 85% at 550 nm measured on UV-Vis spectrophotometer.

To pattern the silver coating, the following procedure was used. AZ® 1512 product of AZ Electronic Material was used as photoresist. A layer of photoresist was spun on the silver coating at a spin speed of 2,500 rpm for 60 seconds. The photoresist was soft-baked at 95° C. for 2 minutes on a hotplate equipped with vacuum chuck. An ABM mask Aligner was used to expose the photoresist through a photomask with 120 mJ energy dose. AZ® 300 MIF developer was used for 60-90 seconds to develop the photoresist material. After development, the photoresist AZ® 1512 was hard-baked at 110° C. on the same hot plate. Transene Aluminum Etchant Type A was used as etchant for the silver nanowires. A DI water wash step was applied after the develop and etch step. Propylene glycol monomethyl ether (PGME) was used to strip the photoresist.

Example 13

OPV Devices Made from HIL and PV2000 Active Layer

The Ag nanoparticle transparent conductor was deposited and patterned as described in Example 12.

The patterned substrate was exposed to a flow of $N_2$ to remove particles from the surface. Each substrate was then coated with a about 30 nm thick layer of HIL (formulation below) by spin coating for 3 seconds at 350 rpm in air, followed by a 30 seconds at 1000 rpm. The devices were then heated on a hotplate for 1 minute at 120° C. in air and were then transferred to a $N_2$ atmosphere glovebox and annealed on a hot plate at 170° C. for 15 min. The formulation information for the HIL is shown below. Methanol was added to the HIL in order to improve the wetting on the Ag nanoparticle surface.

| HIL System | Composition | Wt. % in formulation |
|---|---|---|
| HIL | Sulfonated polymer* | 0.204 |
|  | P4VP | 0.948 |
|  | PSS | 0.012 |
|  | Nafion | 0.036 |
|  | Water | 32.340 |
|  | 1,2 Propanediol | 14.700 |
|  | IPA | 11.760 |
|  | Methanol | 40.000 |

*sulfonated poly(3-(methoxyethoxyethoxy)thiophene-2,5-diyl) was prepared as described in US Patent Publication 2008/0248313.

The active layer was then spin-coated on top of the HIL layer on a Headway spinner in a $N_2$ environment at 300 rpm for 3 seconds and 400 rpm for 200 seconds to obtain the required active layer thickness of about 200 nm. PV2000 active layer formulation is available from Plextronics, Inc. (Pittsburgh, Pa.). The active layer films were then annealed on a hotplate in the $N_2$ environment at 175° C. for 30 minutes. Finally, after annealing, the cathode was vapor deposited from a base pressure of about $7 \times 10^{-7}$. The cathode for the devices was a bilayer of Ca (10 nm) and Al (200 nm). The Ca and Al were deposited at rates of 0.3 A/s and 4 A/s, respectively. The devices were then encapsulated using a cavity glass with one SAES Dynic getter and the edges of the cavity glass sealed with EPO-TEK OG112-4 UV curable glue. The encapsulated device was cured under UV irradiation (80 mW/cm²) for 4 minutes and tested as follows.

The photovoltaic characteristics of devices under white light exposure (Air Mass 1.5 Global Filter) were measured using a system equipped with a Keithley 2400 source meter and an Oriel 300W Solar Simulator based on a Xe lamp with output intensity of 100 mW/cm² (AM1.5G). The light intensity was set using an NREL-certified Si—KG5 silicon photodiode.

The table below (Table 9) summarizes the resulting performance for the standard devices with ITO as the TC versus the devices with Ag nanowire as the TC.

TABLE 9

| TC | Jsc | Voc(V) | FF | E(%) |
|---|---|---|---|---|
| ITO | 9.70 | 0.84 | 0.64 | 5.23 |
| ITO | 9.84 | 0.84 | 0.63 | 5.23 |
| ITO | 6.94 | 0.84 | 0.60 | 3.48 |
| Ag Nanowires | 7.42 | 0.84 | 0.66 | 4.14 |
| Ag Nanowires | 6.87 | 0.84 | 0.66 | 3.84 |

Finally, additional embodiments 1-57 are described in U.S. provisional application 61/246,913:

Embodiment 1

A device comprising: a first layer comprising a plurality of electrically conductive nanowires on a substrate; and a second layer disposed on the nanowires comprising one or more polymers or copolymers, said one or more polymers or copolymers comprising (i) at least one conjugated repeat group, or (ii) at least one heteroaryl group, optionally linked through a keto group or a fluorinated alkylene oxide group.

Embodiment 2

The device of embodiment 1, wherein the conjugated repeat groups comprise polythiophene.

Embodiment 3

The device of embodiment 2, wherein the polythiophene comprises at least one organic substituent.

Embodiment 4

The device of embodiment 3, wherein the substituent is an alkylene oxide, alkoxy or alkyl substituent.

Embodiment 5

The device of embodiment 4, wherein the polythiophene is a regioregular polythiophene.

Embodiment 6

The device of embodiment 5, wherein the degree of regioregularity is at least about 90%.

Embodiment 7

The device of embodiment 2, wherein the polythiophene comprises a regular head-to-tail coupled poly(3-substituted thiophene) having a degree of regioregularity of at least about 90%.

Embodiment 8

The device of embodiment 2, wherein the polythiophene comprises at least one sulfonate substituent comprising sulfonate sulfur bonding directly to the polythiophene backbone.

Embodiment 9

The device of embodiment 8, wherein the polythiophene further comprises at least one organic substituent.

Embodiment 10

The device of embodiment 9, wherein the substituent is an alkylene oxide, alkoxy or alkyl substituent.

Embodiment 11

The device of embodiment 10, wherein the polythiophene is a regioregular polythiophene.

Embodiment 12

The device of embodiment 11, wherein the degree of regioregularity is at least about 90% apart from the sulfonation.

Embodiment 13

The device of embodiment 12, wherein the polythiophene comprises a 3,4-disubstituted polythiophene.

Embodiment 14

The device of embodiment 13, wherein the 3,4-disubstitued polythiophene comprises an alkylene oxide, alkoxy or alkyl substituent in each of the 3 and 4 positions.

Embodiment 15

The device of embodiment 14, wherein the 3,4-disubstitued polythiophene comprises an alkylene oxide in each of the 3 and 4 positions.

Embodiment 16

The device according to embodiment 2, wherein said repeat groups comprise arylamine.

Embodiment 17

The device according to embodiment 16, wherein said repeat groups comprise arylamine groups linked by at least one fluorinated alkyleneoxy group.

Embodiment 18

The device according to embodiment 16, wherein said repeat groups comprise arylamine groups linked by a keto group.

Embodiment 19

The device of embodiment 2, wherein the polythiophene comprises a water soluble polythiophene.

Embodiment 20

The device of embodiment 2, wherein the polythiophene comprises a doped polythiophene.

Embodiment 21

The device of embodiment 2, wherein the polythiophene comprises a self-doped polythiophene.

Embodiment 22

The devices according to embodiment 2, wherein the polymers or copolymers comprise non-regioregular thiophene repeat units.

Embodiment 23

The device of embodiment 1, wherein the plurality of electrically conductive nanowires is at or above an electrical percolation level.

Embodiment 24

The device of embodiment 1, wherein the plurality of electrically conductive nanowires comprises silver.

Embodiment 25

The device of embodiment 1, wherein the device comprises at least two electrodes and at least one light emitting or photoactive layer.

Embodiment 26

The device of embodiment 1, further comprising electrodes, wherein toluene is used to clean said electrodes.

Embodiment 27

The device of embodiment 1, wherein said device comprises an OPV with $\eta$ greater than about 2%.

Embodiment 28

The device of embodiment 1, wherein the first layer comprises a matrix material.

Embodiment 29

The device of embodiment 1, wherein the first layer comprises a non-conductive matrix material.

Embodiment 30

The device of embodiment 1, wherein the first layer comprises a conductive matrix material.

Embodiment 31

A device comprising: a plurality of electrically conductive nanowires on a substrate, and a composition disposed on the nanowires comprising one or more conjugated polymers or copolymers, wherein said device comprises an OPV with $\eta$ greater than about 2%.

Embodiment 32

The device of embodiment 31, wherein the conjugated polymers or copolymers are polythiophenes.

Embodiment 33

The device of embodiment 31, wherein the conjugated polymers or copolymers are regioregular polythiophenes.

Embodiment 34

The device of embodiment 31, wherein the conjugated polymers or copolymers are sulfonated regioregular polythiophenes.

Embodiment 35

The device according to embodiment 31, wherein the nanowires are mixed with a matrix material.

Embodiment 36

The device according to embodiment 31, wherein the nanowires are mixed with a conductive matrix material.

Embodiment 37

The device according to embodiment 31, wherein the nanowires are mixed with a non-conductive matrix material.

Embodiment 38

A device comprising: a plurality of electrically conductive nanowires on a substrate, and at least one composition disposed on the nanowires comprising a water soluble or water dispersible polythiophene comprising (i) at least one organic substituent, and (ii) at least one sulfonate substituent comprising sulfonate sulfur bonding directly to the polythiophene backbone.

Embodiment 39

The device according to embodiment 38, wherein the device comprises an OPV with $\eta$ greater than about 2%.

Embodiment 40

The device according to embodiment 38, wherein the polythiophene comprises a regular head-to-tail coupled poly(3-substituted thiophene) having a degree of regioregularity of at least about 90% apart from sulfonation.

Embodiment 41

The device according to embodiment 38, wherein the polythiophene comprises a water soluble polythiophene.

Embodiment 42

The device according to embodiment 38, wherein the polythiophene comprises a doped polythiophene.

Embodiment 43

The device according to embodiment 38, wherein the polythiophene comprises at least one alkylene oxide, alkoxy or alkyl substituent.

Embodiment 44

The device according to embodiment 38, wherein the polythiophene comprises a polythiophene characterized by an acid number of about 250 or less mg KOH/g polymer.

Embodiment 45

A device comprising: a conductive layer comprising a plurality of conductive nanowires and a non-conductive matrix, and an HTL layer disposed on said conductive layer, said HTL layer comprising one or more polythiophene polymers or copolymers.

Embodiment 46

The device according to embodiment 45, wherein said device comprises an OPV.

Embodiment 47

The device according to embodiment 45, wherein said device comprises an OPV with $\eta$ greater than about 2%.

Embodiment 48

The device according to embodiment 45, wherein said one or more polythiophene polymers or copolymers comprises one or more regioregular polythiophene polymers or copolymers.

Embodiment 49

The device according to embodiment 45, wherein said one or more polythiophene polymers or copolymers comprises one or more regioregular polythiophene polymers or copolymers comprising at least one sulfonate sulfur bonding directly to the polythiophene backbone.

Embodiment 50

The device according to embodiment 45, where said HTL layer is a hole injection layer.

Embodiment 51

The device according to embodiment 45, where said HTL layer comprises multiple layers.

Embodiment 52

The device according to embodiment 45, where said HTL layer is a hole collection layer.

Embodiment 53

The device according to embodiment 45, further comprising electrodes, where toluene is used to clean said electrodes.

Embodiment 54

A device comprising at least one conductive layer, said at least one conductive layer comprising: a plurality of electrically conductive nanowires, and at least one composition comprising a water soluble or water dispersible regioregular polythiophene comprising (i) at least one organic substituent, and (ii) at least one sulfonate substituent comprising sulfonate sulfur bonding directly to the polythiophene backbone.

Embodiment 55

A device comprising at least one conductive layer and at least one other layer disposed on the conductive layer, said at least one conductive layer comprising a plurality of electrically conductive nanowires, and said at least one other layer selected from the group: hole injection layer, hole transport layer, overcoat layer, or hole collection layer, wherein said at least one other layer comprises at least one composition comprising a water soluble or water dispersible regioregular polythiophene comprising (i) at least one organic substituent, and (ii) at least one sulfonate substituent comprising sulfonate sulfur bonding directly to the polythiophene backbone.

Embodiment 56

The device according to embodiment 55, wherein the device comprises an OPV with η greater than about 2%.

Embodiment 57

A device comprising: a first layer comprising a plurality of electrically conductive nanowires on a substrate; and a second layer disposed on the nanowires comprising one or more polymers or copolymers, said one or more polymers or copolymers comprising at least one heteroaryl group or at least one polyarylamine, wherein said heteroaryl group or polyarylamine are optionally linked through a keto group or a fluorinated alkyleneoxy group.

What is claimed is:

1. A device comprising:
a substrate;
an electrode layer disposed on the substrate, the electrode layer comprising a plurality of electrically conductive nanowires; and
at least one hole injection layer, hole transport layer, overcoat layer, or hole collection layer disposed on the electrode layer and comprising a water soluble or water dispersible polythiophene comprising (i) at least one organic substituent, and (ii) at least one sulfonate substituent comprising sulfonate sulfur bonded directly to the polythiophene backbone.

2. The device according to claim 1, wherein the device comprises an organic photovoltaic device with a power conversion efficiency η greater than about 2%.

3. The device according to claim 1, wherein the polythiophene comprises a regular head-to-tail coupled poly(3-substituted thiophene).

4. The device according to claim 3, wherein the polythiophene comprises a regular head-to-tail coupled poly(3-substituted thiophene) having a degree of regioregularity of at least about 90% apart from sulfonation.

5. The device according to claim 1, wherein the polythiophene comprises a water soluble polythiophene.

6. The device according to claim 1, wherein the polythiophene comprises a doped polythiophene.

7. The device according to claim 1, wherein the polythiophene comprises at least one alkylene oxide, alkoxy or alkyl substituent.

8. The device according to claim 1, wherein the polythiophene comprises a polythiophene characterized by an acid number of about 250 or less mg KOH/g polymer.

9. The device according to claim 1, wherein the nanowires are silver nanowires.

10. The device according to claim 1, wherein the device is an organic photovoltaic device.

11. The device according to claim 1, wherein the device is an organic light emitting diode device.

12. The device according to claim 1, wherein the nanowires are metal nanowires.

13. The device according to claim 1, wherein the nanowires are carbon nanotubes.

14. The device according to claim 1, wherein the nanowires are metal oxide nanowires.

15. The device according to claim 1, wherein the nanowires are conductive polymer fiber nanowires.

16. The device according to claim 1, wherein the nanowires have a length to diameter ratio greater than 10.

17. The device according to claim 1, wherein:
the polythiophene comprises a regular head-to-tail coupled poly(3-substituted thiophene), and
the nanowires are silver nanowires.

18. The device according to claim 1, wherein:
the polythiophene comprises a regular head-to-tail coupled poly(3-substituted thiophene),
the polythiophene comprises at least one alkylene oxide, alkoxy or alkyl substituent, and
the nanowires are silver nanowires.

19. The device according to claim 1, wherein:
the polythiophene comprises a regular head-to-tail coupled poly(3-substituted thiophene),
the polythiophene comprises at least one alkylene oxide, alkoxy or alkyl substituent,
the polythiophene comprises a polythiophene characterized by an acid number of about 250 or less mg KOH/g polymer, and
the nanowires are silver nanowires.

* * * * *